(12) United States Patent
Cheng et al.

(10) Patent No.: US 8,623,712 B2
(45) Date of Patent: *Jan. 7, 2014

(54) BULK FIN-FIELD EFFECT TRANSISTORS WITH WELL DEFINED ISOLATION

(71) Applicant: International Business Machines Corporation, Armonk, NY (US)

(72) Inventors: Kangguo Cheng, Schenectady, NY (US); Balasubramanian S. Haran, Watervliet, NY (US); Shom Ponoth, Clifton Park, NY (US); Theodorus E. Standaert, Clifton Park, NY (US); Tenko Yamashita, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/852,428

(22) Filed: Mar. 28, 2013

(65) Prior Publication Data

US 2013/0210206 A1    Aug. 15, 2013

Related U.S. Application Data

(63) Continuation of application No. 13/277,956, filed on Oct. 20, 2011, now Pat. No. 8,420,459.

(51) Int. Cl.
*H01L 21/00* (2006.01)
*H01L 21/84* (2006.01)

(52) U.S. Cl.
USPC 438/149; 438/151; 257/E21.32; 257/E21.561

(58) Field of Classification Search
USPC .................. 438/149, 150, 151, 269, 479; 257/E21.32, E21.561, E21.7
See application file for complete search history.

(56) References Cited

U.S. PATENT DOCUMENTS

| 5,429,956 | A   |   | 7/1995 | Shell et al. |   |
|-----------|-----|---|--------|--------------|---|
| 6,770,516 | B2  |   | 8/2004 | Wu et al.    |   |
| 7,692,254 | B2  | * | 4/2010 | Anderson et al. | 257/401 |
| 7,781,315 | B2  | * | 8/2010 | Lenoble      | 438/514 |
| 8,420,459 | B1  | * | 4/2013 | Cheng et al. | 438/149 |

(Continued)

OTHER PUBLICATIONS

Okano, K., et al., "Progress Integration Technology and Device Characteristics of CMOS FinFET on Bulk Silicon Substrate with Sub-10 nm Fin Width and 20 nm Gate Length," IEEE Electron Device Meeting, 2005, 0-7803-9269-8/05.

(Continued)

*Primary Examiner* — Hoai V Pham
(74) *Attorney, Agent, or Firm* — Thomas Grzesik; Fleit Gibbons Gutman Bongini & Bianco PL

(57) ABSTRACT

A fin field-effect-transistor fabricated by forming a dummy fin structure on a semiconductor substrate. A dielectric layer is formed on the semiconductor substrate. The dielectric layer surrounds the dummy fin structure. The dummy fin structure is removed to form a cavity within the dielectric layer. The cavity exposes a portion of the semiconductor substrate thereby forming an exposed portion of the semiconductor substrate within the cavity. A dopant is implanted into the exposed portion of the semiconductor substrate within the cavity thereby creating a dopant implanted exposed portion of the semiconductor substrate within the cavity. A semiconductor layer is epitaxially grown within the cavity atop the dopant implanted exposed portion of the semiconductor substrate.

20 Claims, 7 Drawing Sheets

(56) References Cited

U.S. PATENT DOCUMENTS

| | | |
|---|---|---|
| 2009/0302372 A1 | 12/2009 | Chang et al. |
| 2010/0163971 A1 | 7/2010 | Hung et al. |
| 2011/0068375 A1 | 3/2011 | Jakschik et al. ............. 257/255 |

OTHER PUBLICATIONS

Hisamoto, D., et al., "A Fully Depleted Lean-Channel Transistor (DELTA)—A Novel Vertical Ultrathin SOI MOSFET," IEEE Electron Device Letters, vol. 11, No. 1, Jan. 1990, pp. 36-38, 741-3106/90/0100-0036.

Xu, X., et al., "High-Performance BOI FinFETs Based on Bulk-Silicon Substrate," IEEE Transactions on Electron Devices, vol. 55, No. 11, Nov. 2008, pp. 3246-3250, 0018-9383.

Kawasaki, H., et al., "Embedded Bulk FinFET SRAM Cell Technology with Planar FET Peripheral Circuit for hp32 nm Node and Beyond," IEEE 2006 Symposium on VLSI Technology Digest of Technical Papers, 1-4244-0005-8/06.

\* cited by examiner

BULK FIN-FIELD EFFECT TRANSISTORS WITH WELL DEFINED ISOLATION

CROSS-REFERENCE TO RELATED APPLICATIONS

This application is continuation of and claims priority from U.S. patent application Ser. No. 13/277,956 filed on Oct. 20, 2011, now U.S. Pat. No. 8,420,459, the disclosure of which is hereby incorporated by reference in its entirety.

FIELD OF THE INVENTION

The present invention generally relates to the field of semiconductors, and more particularly relates to fin field effect transistors.

BACKGROUND OF THE INVENTION

FinFET (fin field-effect-transistor) technology has gaining interest as one of device option for future CMOS technology. However, current technologies for forming the fin structures of a finFET are generally expensive and/or suffer from high process complexities.

SUMMARY OF THE INVENTION

In one embodiment, a computer program storage product for forming a fin field-effect-transistor is disclosed. The computer program storage product comprises instructions configured to perform a method. The method comprises forming a dielectric layer on the semiconductor substrate. The dielectric layer surrounds the dummy fin structure. The dummy fin structure is removed to form a cavity within the dielectric layer. The cavity exposes a portion of the semiconductor substrate thereby forming an exposed portion of the semiconductor substrate within the cavity. A dopant is implanted into the exposed portion of the semiconductor substrate within the cavity thereby creating a dopant implanted exposed portion of the semiconductor substrate within the cavity. A semiconductor layer is epitaxially grown within the cavity atop the dopant implanted exposed portion of the semiconductor substrate.

In another embodiment, a computer program storage product for forming a fin field-effect-transistor is disclosed. The computer program storage product comprises instructions configured to perform a method. The method comprises forming a dielectric layer on a semiconductor substrate. A portion of the dielectric layer is removed. A remaining portion of the dielectric forms a dummy fin structure on the semiconductor substrate. A dielectric layer is formed on the semiconductor substrate. The dielectric layer surrounds the dummy fin structure. The dummy fin structure is removed to form a cavity within the dielectric layer. The cavity exposes a portion of the semiconductor substrate thereby forming an exposed portion of the semiconductor substrate within the cavity. A dopant is implanted into the exposed portion of the semiconductor substrate within the cavity thereby creating a dopant implanted exposed portion of the semiconductor substrate within the cavity. A semiconductor layer is epitaxially grown within the cavity atop the dopant implanted exposed portion of the semiconductor substrate.

In yet another embodiment, a computer program storage product for forming a fin field-effect-transistor is disclosed. The computer program storage product comprises instructions configured to perform a method. The method comprises forming a dummy fin structure on a semiconductor substrate. A portion of the dielectric layer is removed. A remaining portion of the dielectric layer forms a dummy fin structure on the semiconductor substrate. A dielectric layer is formed on the semiconductor substrate. The dielectric layer surrounds the dummy fin structure. The dummy fin structure is removed to form a cavity within the dielectric layer. The cavity exposes a portion of the semiconductor substrate thereby forming an exposed portion of the semiconductor substrate within the cavity. A dopant is implanted into the exposed portion of the semiconductor substrate within the cavity thereby creating a dopant implanted exposed portion of the semiconductor substrate within the cavity. A semiconductor layer is epitaxially grown within the cavity atop the dopant implanted exposed portion of the semiconductor substrate. After epitaxially growing the semiconductor layer, the dielectric layer is removed to form a fin structure including at least the semiconductor layer that is atop the portion of the semiconductor substrate that has been implanted with the dopant. A gate structure is formed in direct contact with at least a portion of the fin structure.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
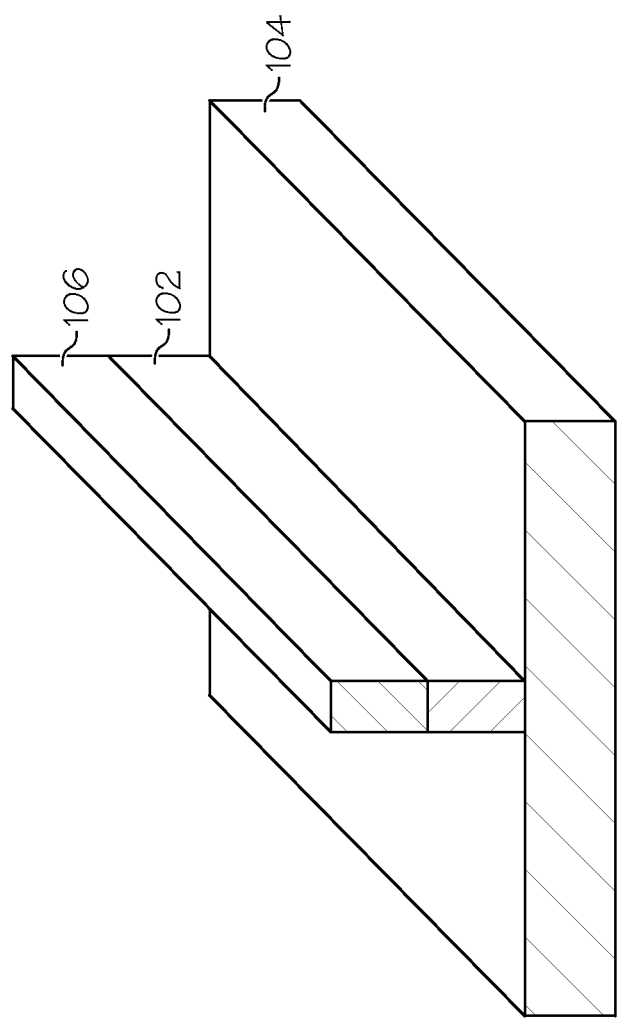
FIG. 1 is a cross-sectional view of a semiconductor structure after formation of a dummy fin on a semiconductor substrate according to one embodiment of the present invention.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Conventional processes for forming finFET devices are generally expensive or suffer from high complexity processes. For example, SOI (silicon-on-insulator) substrate processes can be expensive due to the high cost of the SOI substrate. Some conventional processes also cannot obtain a uniform fin thickness for both nMOS and pMOS devices. Even further, some conventional processes involve doping the fin, which reduces mobility and increases the radial-distribution function (RDF). Therefore, one or more embodiments of the present invention provide a method for forming finFETs on bulk substrates with robust isolation. As will be discussed in greater detail below, a dummy fin is formed on a bulk semiconductor substrate and removed through a replacement-metal-gate (RMG) type process flow. A punch-through stopper (PTS) is implanted through the cavity left after removing the dummy fin. Since the fin has not been formed at this point, there is no concern with doping the fin. A semiconductor layer is epitaxially grown to form the fins. For stress, Si:Ge can be grown on pMOS devices and Si:C can be grown on nMOS devices. After the epi growth, the fin can be capped with a hard mask (e.g., oxide, nitride, or a composite of oxide and nitride). A dielectric layer surrounding the fins can be removed with a wet etch or isotropic dry etch. The bulk semiconductor substrate is recessed and an oxide (or other insulating material) is deposited thereon. This oxide is then recessed below the fin. The resulting structure is a fin on bulk substrate.

FIGS. 1 to 6 illustrate cross-sectional views of a finFET transistor being formed utilizing a replacement gate process flow according to one embodiment of the present invention. In particular, FIG. 1 is a cross-sectional view of a semiconductor structure after formation of a dummy fin on a semiconductor substrate according to one embodiment of the present invention. For example, FIG. 1 shows a semiconductor structure comprising a dummy fin 102 that has been formed on a bulk semiconductor substrate 104. An optional hard mask 106 can be formed atop the dummy fin 102 as well. The bulk semiconductor substrate 104 includes at least one of Si, Ge, SiGe, GaAs, InAs, InP, SiCGe, SiC as well as other III/V or II/VI compound semiconductors and alloys thereof. In one embodiment, the initial structure shown in FIG. 1 is formed by depositing a dielectric layer atop the bulk semiconductor substrate 104. The dielectric layer can include a dummy dielectric such as, but not limited to crystalline or non-crystalline oxide, polysilicon, amorphous silicon, nitride, oxynitride, a combination thereof, or any other insulating material.

An optional hard mask layer comprising, for example, a dielectric material composed of a nitride, oxide, oxynitride material, and/or any other suitable dielectric layer can be deposited atop the dielectric layer. The optional hard mask layer may include a single layer of dielectric material or multiple layers of dielectric materials. The optional hard mask layer can be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the optional hard mask layer 106 may be formed using a growth process, such as thermal oxidation or thermal nitridation. Thereafter, the dummy fin 102 along with the optional hard mask 106 is formed from the dielectric layer (and any additional layers such as a polysilicon layer) and optional hard mask layer, respectively, using photolithography and etching.

Figure 2:
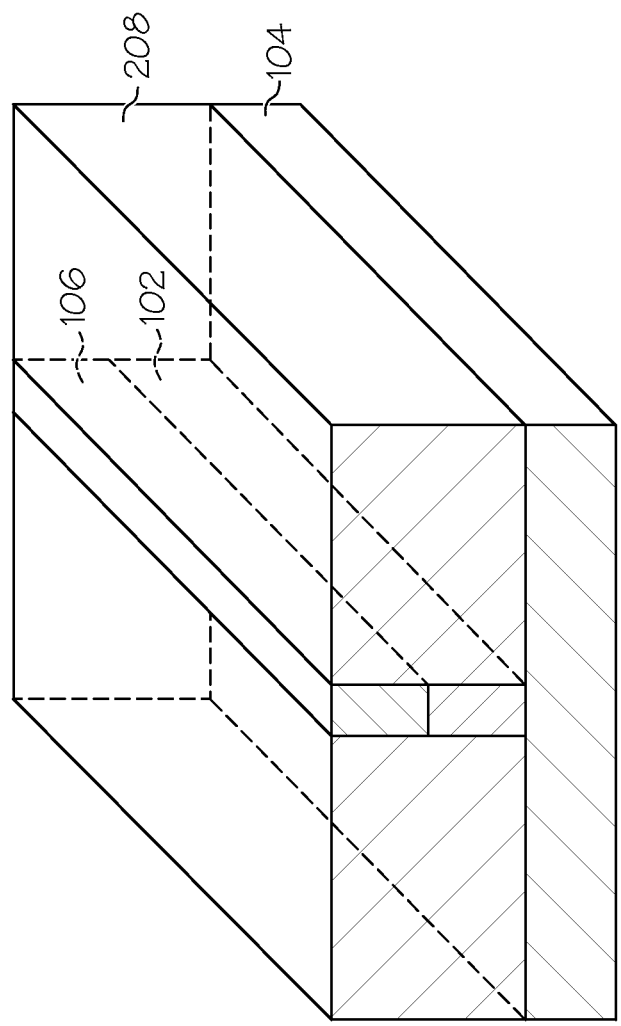
FIG. 2 is a cross-sectional view of the semiconductor structure after a dielectric layer has been formed over an optional hard mask, dummy fin, and the semiconductor substrate according to one embodiment of the present invention.

FIG. 2 shows the semiconductor structure after a dielectric layer 208 has been formed over the dummy fin 102, semiconductor substrate 104, and the optional hard mask 106. For example, after the dummy fin 102 and optional hard mask 106 have been formed a dielectric layer 208 (e.g., a nitride layer) is then formed over the semiconductor substrate 104, the dummy fin structure 102, and the hard mask 106. This dielectric layer 208 is etched/polished down until the hard mask 106 (or dummy fin structure 102 if a hard mask 106 is not formed).

Figure 3:
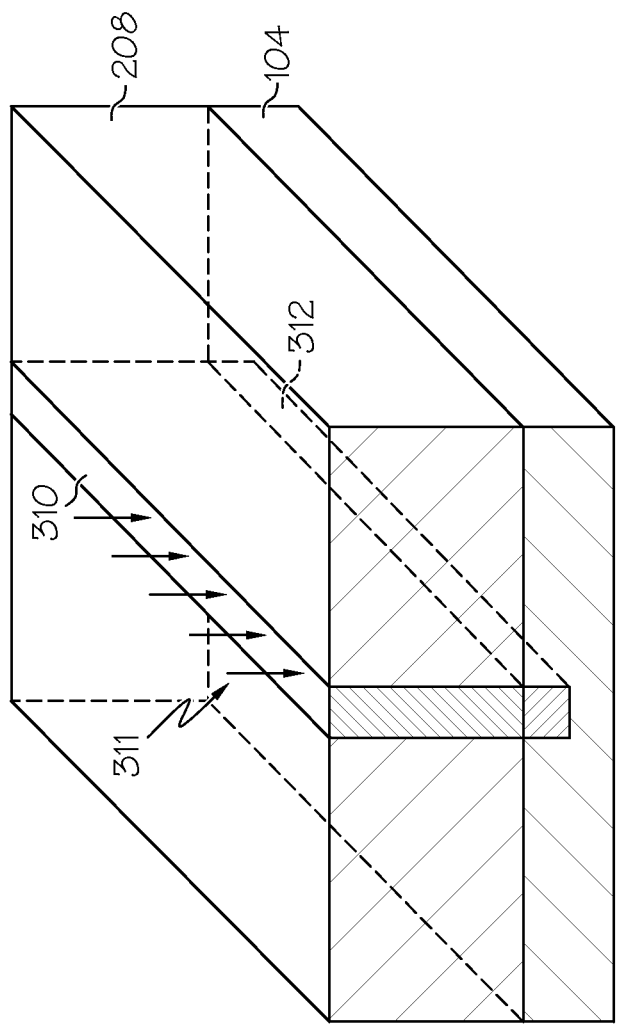
FIG. 3 is a cross-sectional view of the semiconductor structure after a fin cavity has been formed in the dielectric layer and a punch-through stopper has been implanted into an exposed portion of the semiconductor substrate according to one embodiment of the present invention.
Figure 5:
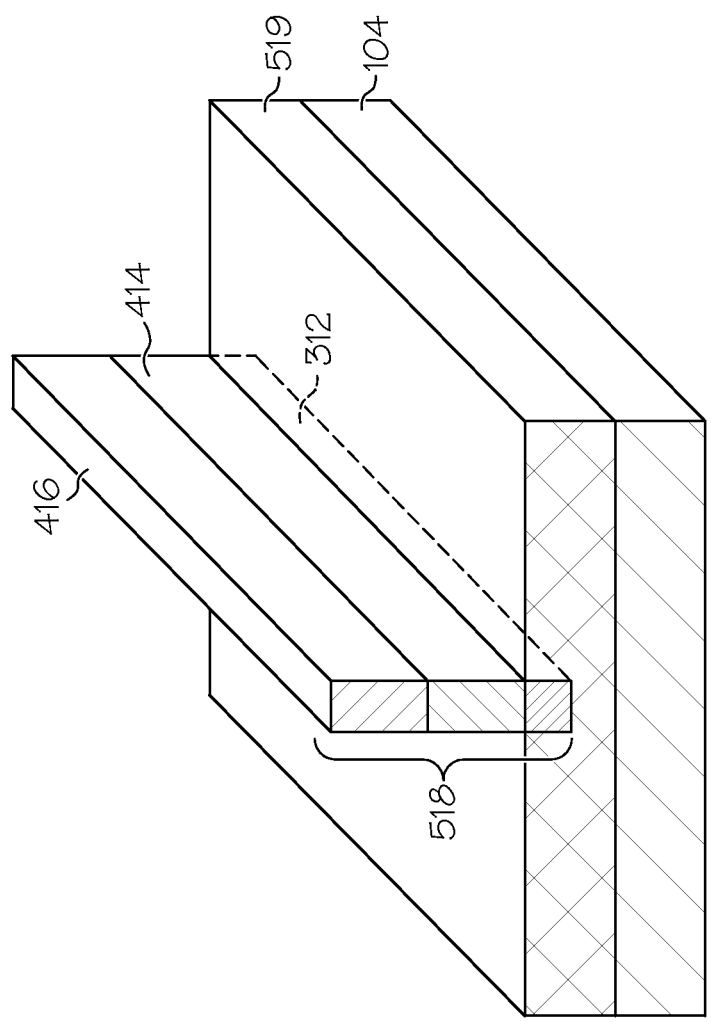
FIG. 5 is a cross-sectional view of the semiconductor structure after removing the dielectric layer and forming a fin structure according to one embodiment of the present invention.

FIG. 3 shows the semiconductor structure after a fin cavity 310 has been formed and a punch-through stopper (PTS) 312 has been implanted into an exposed portion of the semiconductor substrate 104. For example, the dummy fin 102 and optional hard mask 106 are removed down to the substrate 104 via selective etching or other conventional techniques. The dummy fin removal process forms a fin cavity 310, which exposes a portion of the semiconductor substrate 104. A punch-through implantation process is then performed for implanting a punch-through stopper (PTS) 312 into the semiconductor substrate 104, as shown by the arrows 311. The PTS 312 electrically isolates the semiconductor substrate 104 from a subsequently formed fin 518 (FIG. 5). A separate PTS implantation process can be performed for both nMOS and pMOS devices. For example, a p-type PTS dopant can be implanted for an nMOS device while an n-type PTS dopant can be implanted for a pMOS device.

Figure 4:
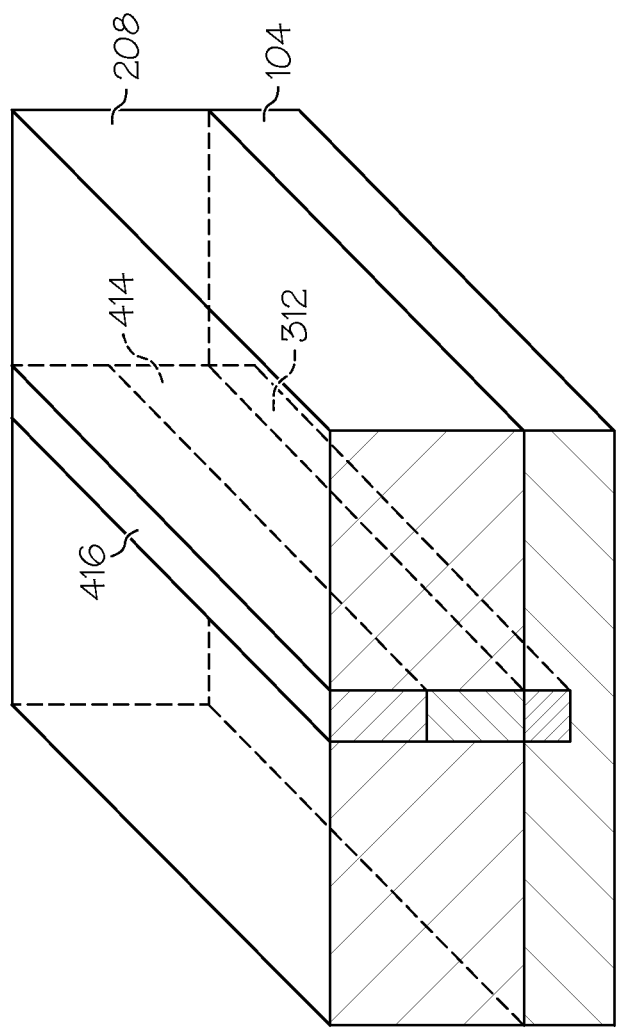
FIG. 4 is a cross-sectional view of the semiconductor structure after a semiconductor layer has been formed on the punch-through stopper according to one embodiment of the present invention.

FIG. 4 shows the semiconductor structure after a semiconductor layer 414 has been formed on the PTS 312. For example, after the PTS 312 has been formed, a semiconductor layer 414 (e.g., fin layer) is formed on the PTS 312 and within the fin cavity 310. In this embodiment, the semiconductor layer 414 is formed through an epitaxial growth process. For example, Si:Ge can be epitaxially grown from the PTS 312 within the semiconductor substrate 104 for a pMOS device, while Si (or Si:C) can be epitaxially grown from the PTS 312 within the semiconductor substrate 104 for an nMOS device. Alternatively, Si can be epitaxially grown for both pMOS and nMOS devices.

In one embodiment, the epitaxially grown Si:Ge is under an intrinsic compressive strain that is produced by a lattice mismatch between the larger lattice dimension of the Si:Ge and the smaller lattice dimension of the layer on which the Si:Ge is epitaxially grown. The epitaxially grown Si:Ge produces a compressive strain in a portion of the semiconductor substrate 104. In another embodiment, epitaxially grown Si:C (carbon doped silicon) is under an intrinsic tensile strain that is produced by a lattice mismatch between the smaller lattice dimension of the Si:C and the larger lattice dimension of the layer on which the Si:C is epitaxially grown. The epitaxial grown Si:C produces a tensile strain in a portion of the semiconductor substrate 104.

It should be noted that a hard mask 416 can also be formed on the semiconductor layer 414 that has been formed in the fin cavity 310. The hard mask 416 can include a dielectric material composed of a nitride, oxide, oxynitride material, and/or any other suitable dielectric layer. The hard mask 416 may include a single layer of dielectric material or multiple layers of dielectric materials. The hard mask 416 can be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the hard mask 416 may be formed using a growth process, such as thermal oxidation or thermal nitridation.

FIG. 5 shows the semiconductor structure after removing the dielectric layer 208 and forming a fin structure 518. For example, a photoresist mask is formed overlying the hard mask 416, in which the portion of the hard mask 416 and the semiconductor layer 414 that is underlying the photoresist mask provides the fin structure 518. The exposed portions of the dielectric layer 208 that is not protected by the photoresist mask is removed using a selective etch process. To provide the photoresist mask, a photoresist layer is first positioned on the dielectric 208 and hard mask 416. The photoresist layer may be provided by a blanket layer of photoresist material that is formed utilizing a deposition process such as, for example, CVD, PECVD, evaporation, or spin-on coating. The blanket layer of photoresist material is then patterned to provide the photoresist mask utilizing a lithographic process that may include exposing the photoresist material to a pattern of radiation and developing the exposed photoresist material utilizing a resist developer.

Following the formation of the photoresist mask, an etching process may remove the unprotected dielectric layer 208 selective to the underlying hard mask 416 and semiconductor layer 414. For example, the transferring of the pattern provided by the photoresist into the underlying structures may include an anisotropic etch. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point include ion beam etching, plasma etching or laser ablation. Also, a hot phosphorus etching process can be used as well. Once the dielectric layer 208 has been removed, an anneal (such as, but not limited to, an $H_2$ anneal) can be performed to repair the sidewalls of the fin structure 518 and to smoothen the surface thereof. A portion of the bulk semiconductor substrate 104 is recessed and a dielectric layer 519 is deposited atop the bulk semiconductor substrate 104. This dielectric layer 519 can be a crystalline or non-crystalline oxide, nitride, oxynitride, or any other insulating material.

Figure 6:
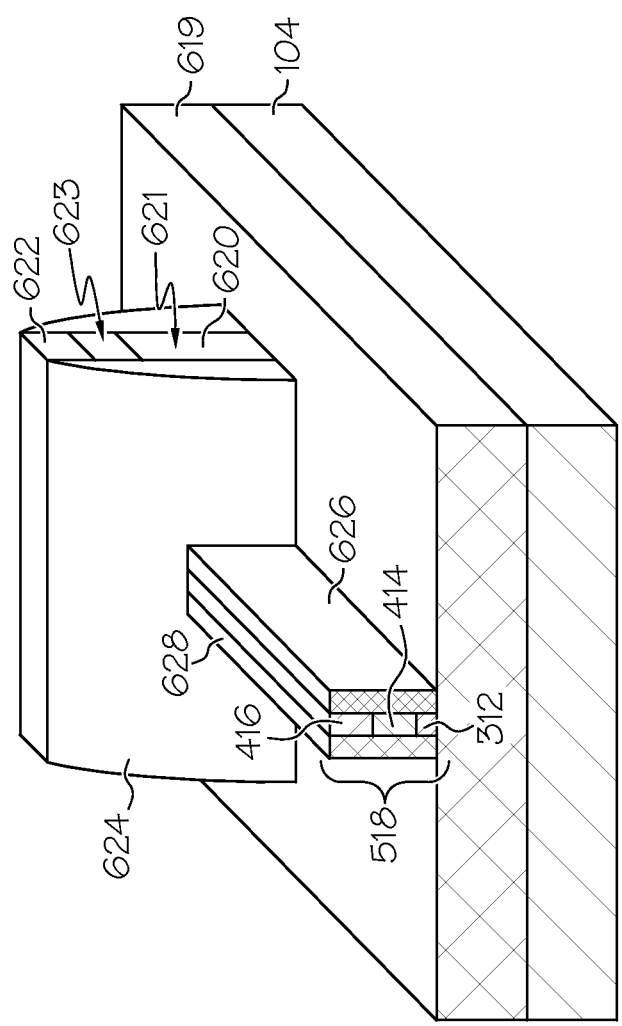
FIG. 6 is a cross-sectional view of the semiconductor structure after forming a gate structure over the fin structure according to one embodiment of the present invention.

FIG. 6 shows the semiconductor structure after forming a gate structure over the fin structure 518. For example, the dielectric layer 519 is recessed forming the dielectric layer 619 shown in FIG. 6. In one embodiment the dielectric layer 519 is recessed below the fin structure (i.e., recessed to at or below the PTS 312) exposing the PTS 312 resulting in the fin structure 518 shown in FIG. 6. As can be seen, the fin structure 518 includes the semiconductor layer 414 formed atop the PTS 312 and a hard mask 416 formed atop the semiconductor layer 414.

A gate 620 (comprising a gate dielectric 621 and gate conductor 623) with an optional gate hard mask 622 is then formed over the fin structure 518 using either a replacement/dummy gate or gate-first process. A gate (dielectric) spacer 624 is formed around the gate 620 and optional hard mask 622. With respect to the replacement gate process, a replacement (dummy) gate is formed on the fin structure 518. The replacement gate is formed using oxide, polysilicon, amorphous silicon, nitride, or a combination thereof. This replacement gate acts as a place holder for a gate stack. Once the replacement gate is formed, an optional hard mask can be formed on top of the replacement gate. The hard mask includes a dielectric material such as a nitride, oxide, oxynitride material, and/or any other suitable dielectric layer. The optional hard mask can be a single layer of dielectric material or multiple layers of dielectric materials, and can be formed by a deposition process such as chemical vapor deposition (CVD) and/or atomic layer deposition (ALD). Alternatively, the hard mask can be grown, such as through thermal oxidation or thermal nitridation.

The gate (dielectric) spacer 624 is then formed surrounding the replacement gate by depositing a conformal layer of dielectric material (such as an oxide, nitride, or oxynitride) and then performing an anisotropic etch (such as a reactive ion etch). After the gate spacer 624 has been formed, source and drain regions 626, 628 may be provided on opposing sides of the channel. For example, dopants may be implanted via ion implantation into each end of the fin structure 518 to produce n-type conductivity or p-type conductivity dopant regions, i.e., source and drain regions 626, 628. P-type conductivity dopant regions are produced in fin structures 518 by doping a portion of the fin structure 518 with group III-A elements of the periodic table of elements, such as Boron (B). N-type conductivity is produced in the fin structures 518 by doping the fin structure 518 with group V elements, such as Phosphorus (P) or Arsenic (As).

After the source/drain regions 626, 628 have been formed, a dielectric layer (e.g., an oxide layer) is then formed over the fin structure 518, the replacement gate, and the hard mask. This dielectric layer is etched down to the upper surface of the hard mask (or the replacement gate in embodiments in which a hard mask is not used). Then the replacement gate and hard mask are removed via selective etching or another conventional technique, as discussed above. This forms a gate cavity that exposes a portion (an upper horizontal surface and vertical walls) of the fin structure 518.

A high-k dielectric material is blanket deposited (for example, by CVD, PECVD, or ALD) and then selectively etched using a process such as RIE to form a high-k dielectric layer 621 on the exposed portion of the fin structure 518. In one embodiment, the gate dielectric includes, but is not limited to, an oxide, nitride, oxynitride and/or silicates including metal silicates, aluminates, titanates, and nitrides. In one example, when the gate dielectric includes an oxide, the oxide may be selected from the group including, but not limited to: $SiO_2$, $HfO_2$, $ZrO_2$, $Al_2O_3$, $TiO_2$, $La_2O_3$, $SrTiO_3$, $LaAlO_3$, $Y_2O_3$, and mixture thereof.

After the high-k dielectric layer 621 has been formed, a gate conductor material is then deposited over the structure, lithographically patterned, and etched to form a gate conductor 623. The gate conductor 623 fills the remaining portion of the gate cavity. The gate conductor 623 of this embodiment is a metal gate layer comprising a conductive refractory metal nitride, such as TaN, TiN, WN, TiAlN, TaCN, or an alloy thereof. The conductive material may include polysilicon, SiGe, a silicide, a metal, or a metal-silicon-nitride such as Ta—Si—N. Examples of metals that can be used as the conductive material include, but are not limited to: Al, W, Cu, Ti, or other like conductive metals. Conventional fabrication steps are then performed to form the remainder of the integrated circuit that includes this transistor.

With respect to a gate first process, the gate 620 is formed similar to the process discussed above after the replacement gate has been removed. For example, a gate dielectric layer 621 is formed contacting the fin structure 518. The gate dielectric layer 621 can be positioned on at least the vertical sidewalls of the fin structure 518. The gate dielectric layer 621 can be formed by a thermal growth process or by a deposition process, as discussed above.

After forming the gate dielectric layer 621, a blanket layer of a conductive material which forms the gate conductor 623 of the gate structure 620 is formed on the gate dielectric utilizing one or more of the processes discussed above. The blanket layer of conductive material may be doped or undoped. If doped, an in-situ doping deposition process may be employed. Alternatively, a doped conductive material can be formed by deposition, ion implantation and annealing. After deposition of at least the gate dielectric and the conductive material, the gate structure 620 including the gate conductor 623 and dielectric 621 is formed, where the gate dielectric 621 is positioned between the gate conductor 623 and the fin structure 518. In one embodiment, the gate structure 620 is formed by first providing a patterned mask atop the conductive material by deposition and lithography and then transferring the pattern to the conductive material and the gate dielectric. The etching steps may include one or more etching processes including dry etching, such as RIE. The region of fin structure 518 in which the gate conductor crosses over is the channel region. The gate spacer 624 can then be formed around the gate 620 (and optional mask 622) directly contacting the gate 620 (and optional mask 622). In one embodiment, the gate spacer 624 is formed by depositing a conformal layer of dielectric material, such as oxides, nitrides, or oxynitrides and performing an etching process. One example of an etching process is an anisotropic etching process, such as reactive ion etch. The source and drain regions 626, 628 can then be provided on opposing sides of the channel, as discussed above. Conventional fabrication steps are then performed to form the remainder of the integrated circuit that includes this transistor.

Figure 7:
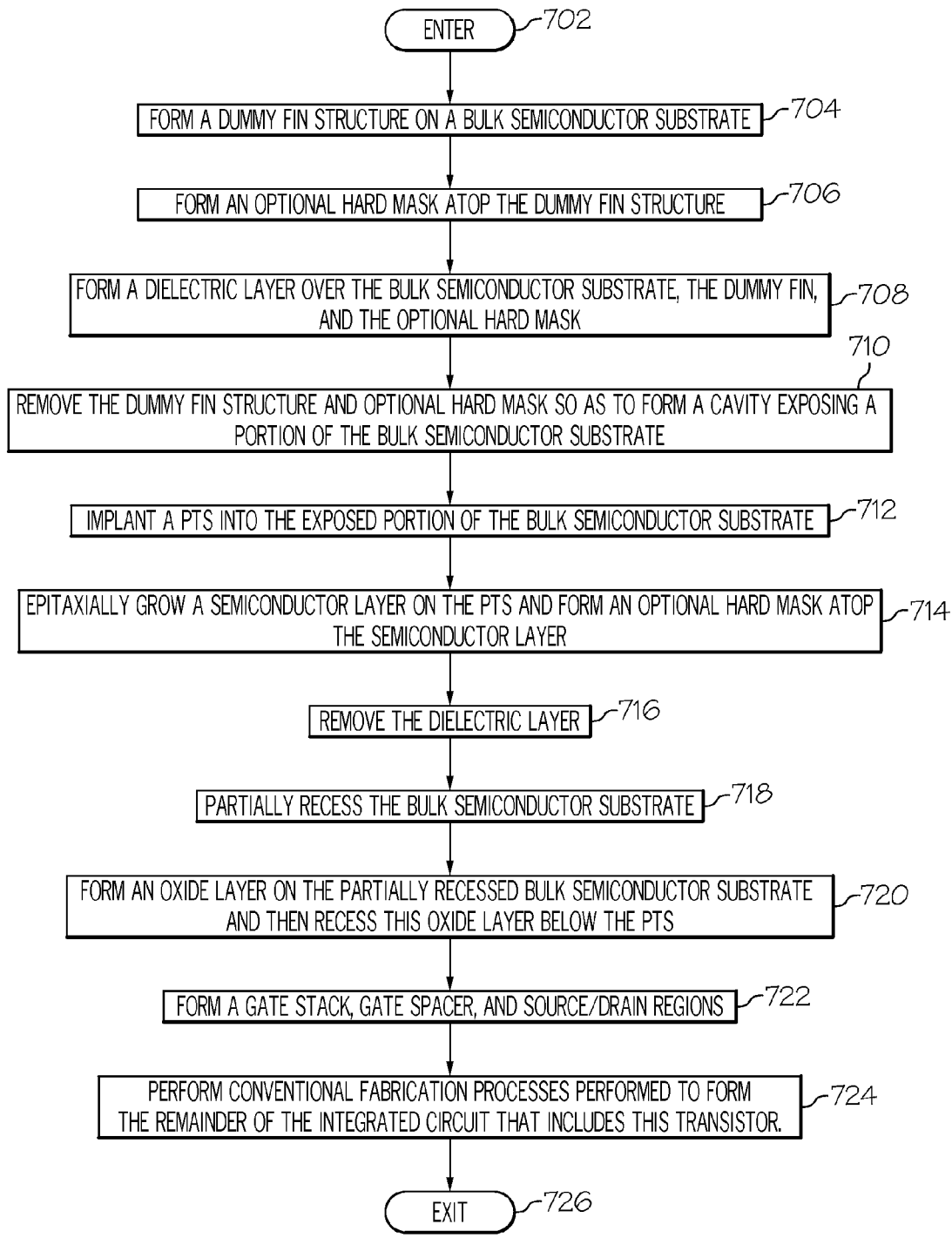
FIG. 7 is an operational flow diagram illustrating one example of a process for forming a finFET transistor utilizing a replacement gate process flow according to one embodiment of the present invention.

FIG. 7 is an operational flow diagram illustrating one process for forming a finFET transistor utilizing a replacement gate process flow according to one embodiment of the present invention. In FIG. 7, the operational flow diagram begins at step 702 and flows directly to step 704. It should be noted that each of the steps shown in FIG. 7 has been discussed in greater detail above with respect to FIGS. 1-6. A dummy fin structure 102, at step 704, is formed on a bulk semiconductor substrate 104. An optional hard mask 106, at step 706, is formed atop the dummy fin structure 102. A dielectric layer 208, at step 708, is formed over the bulk semiconductor substrate 104, the dummy fin 102, and the optional hard mask 106.

The dummy fin 102 and optional hard mask 106, at step 710, are removed to form a cavity 310 exposing a portion of the bulk semiconductor substrate 104. A PTS 312, at step 712, is implanted into the exposed portion of the bulk semiconductor substrate 104. A semiconductor layer 414, at step 714, is epitaxially grown on the PTS 312 and an optional hard mask 416 is formed atop the semiconductor layer 414. The dielectric layer 208, at step 716, is removed. The bulk semiconductor substrate 104, at step 718, is partially recessed. An oxide layer, at step 720, is deposited on the partially recessed bulk semiconductor substrate 104 and then recessed to at or below the PTS 312. This forms a fin structure 518 comprising the PTS 312, the semiconductor layer 414, and the hard mask 416. A gate stack 620, 622, gate spacer 624, and source/drain regions 626, 628, at step 722, are then formed. Conventional fabrication processes, at step 724, are then performed to form the remainder of the integrated circuit that includes this transistor. The control flow then exits at step 726.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for forming a fin field-effect-transistor, the method comprising:
   with a cavity formed in a dielectric layer on a semiconductor substrate, and wherein the cavity exposing a portion of the semiconductor substrate within the cavity, implanting a dopant into the exposed portion of the semiconductor substrate within the cavity; and
   epitaxially growing a semiconductor layer within the cavity atop the dopant implanted exposed portion of the semiconductor substrate, where a height of the cavity defines a height of the epitaxially grown semiconductor.

2. The method of claim 1, wherein after epitaxially growing the semiconductor layer, the method further comprising:
   removing the dielectric layer to form a fin structure comprising the semiconductor layer, the fin structure atop the dopant implanted exposed portion of the semiconductor substrate.

3. The method of claim 2, further comprising:
   forming a gate structure in direct contact with at least a portion of the fin structure.

4. The method of claim 3, further comprising:
   forming a gate spacer adjacent to the gate structure.

5. The method of claim 2, further comprising:
   recessing the semiconductor substrate; and thereafter depositing a second dielectric layer on the semiconductor substrate.

6. The method of claim 5, further comprising:
   recessing the second dielectric layer to at or below the portion of the semiconductor substrate implanted with the dopant.

7. The method of claim 1, wherein the dopant is a punch-through stopper dopant.

8. A method for forming a fin field-effect-transistor, the method comprising:
   with a dummy fin structure formed of dielectric material on a semiconductor substrate, forming a second dielectric layer on the semiconductor substrate, the second dielectric layer surrounding the dummy fin structure;
   removing the dummy fin structure so that a cavity is formed within the second dielectric layer, wherein the cavity exposes a portion of the semiconductor substrate within the cavity;
   implanting a dopant into the exposed portion of the semiconductor substrate within the cavity; and
   epitaxially growing a semiconductor layer within the cavity atop the dopant implanted exposed portion of the semiconductor substrate.

9. The method of claim 8, wherein after epitaxially growing the semiconductor layer, the method further comprising:
   removing the second dielectric layer to form a fin structure comprising the semiconductor layer, the fin structure atop the dopant implanted exposed portion of the semiconductor substrate.

10. The method of claim 9, further comprising:
    forming a gate structure in direct contact with at least a portion of the fin structure.

11. The method of claim 10, further comprising:
    forming a gate spacer adjacent to the gate structure.

12. The method of claim 9, further comprising:
    recessing the semiconductor substrate; and thereafter depositing a third dielectric layer on the semiconductor substrate.

13. The method of claim 12, further comprising:
    recessing the third dielectric layer to at or below the portion of the semiconductor substrate implanted with the dopant.

14. The method of claim 9, wherein the dopant is a punch-through stopper dopant.

15. A method for forming a fin field-effect-transistor, the method comprising:
    with a dummy fin structure formed of dielectric material on a semiconductor substrate, forming a second dielectric layer on the semiconductor substrate, the second dielectric layer surrounding the dummy fin structure;
    removing the dummy fin structure so that a cavity is formed within the second dielectric layer, wherein the cavity exposes a portion of the semiconductor;
    implanting a dopant into the exposed portion of the semiconductor substrate within the cavity;
    epitaxially growing a semiconductor layer within the cavity atop the dopant implanted exposed portion of the semiconductor substrate;
    after epitaxially growing the semiconductor layer, removing the second dielectric layer to form a fin structure comprising the semiconductor layer, the fin structure atop the dopant implanted exposed portion of the semiconductor substrate; and
    forming a gate structure in direct contact with at least a portion of the fin structure.

16. The method of claim 15, further comprising:
    recessing the semiconductor substrate; and thereafter depositing a third dielectric layer on the semiconductor substrate.

17. The method of claim 16, further comprising:
    recessing the third dielectric layer to at or below the portion of the semiconductor substrate implanted with the dopant.

18. The method of claim 15, wherein the dopant is a punch-through stopper dopant.

19. The method of claim 15, wherein forming the gate structure comprises:
    forming a dummy gate on the fin structure;
    forming a gate spacer around the dummy gate and on the semiconductor substrate;
    forming a third dielectric layer on the semiconductor substrate and the gate spacer;
    removing the dummy gate to expose a portion of the fin structure
    forming a fourth dielectric layer on the portion of the fin structure and sidewalls of the gate spacer; and
    forming a conductive layer on the fourth dielectric layer and sidewalls of the gate spacer.

20. The method of claim 15, wherein forming the gate structure comprises:
    forming a third dielectric layer on a portion of the fin structure;

forming a conductive layer on the third dielectric layer; and forming a gate spacer on the semiconductor substrate, the gate spacer surrounding the third dielectric layer and the conductive layer.

\* \* \* \* \*